United States Patent
Fitzgerald

(10) Patent No.: US 8,564,338 B2
(45) Date of Patent: Oct. 22, 2013

(54) SWITCHABLE LOAD FOR INITIALIZING AN OUTPUT VOLTAGE OF A POWER SUPPLY

(75) Inventor: William Vincent Fitzgerald, Zionsville, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 529 days.

(21) Appl. No.: 12/735,697

(22) PCT Filed: Dec. 11, 2008

(86) PCT No.: PCT/US2008/013578
§ 371 (c)(1), (2), (4) Date: Aug. 9, 2010

(87) PCT Pub. No.: WO2009/110875
PCT Pub. Date: Sep. 11, 2009

(65) Prior Publication Data
US 2010/0308875 A1 Dec. 9, 2010

Related U.S. Application Data

(60) Provisional application No. 61/067,902, filed on Mar. 3, 2008.

(51) Int. Cl.
*H03L 7/00* (2006.01)

(52) U.S. Cl.
USPC .......................................................... 327/142

(58) Field of Classification Search
USPC .............................................. 327/142, 143, 198
See application file for complete search history.

(56) References Cited

U.S. PATENT DOCUMENTS

| 4,532,436 | A | 7/1985 | Bismarck |
| 5,744,990 | A | 4/1998 | Burstein et al. |
| 5,999,429 | A | 12/1999 | Brown |
| 6,111,441 | A | 8/2000 | Hartley et al. |
| 6,175,253 | B1 | 1/2001 | Maiyuran et al. |
| 6,327,193 | B1 * | 12/2001 | Morrish ................ 365/189.08 |
| 6,335,648 | B1 | 1/2002 | Matsushita |
| 7,078,944 | B1 | 7/2006 | Jenkins |
| 7,161,396 | B1 | 1/2007 | Zhou et al. |

(Continued)

FOREIGN PATENT DOCUMENTS

| CA | 2245113 | 2/2000 |
| CN | 1649267 | 8/2005 |

(Continued)

*Primary Examiner* — Daniel Rojas
(74) *Attorney, Agent, or Firm* — Robert D. Shedd; Sammy S. Henig

(57) ABSTRACT

A conductive transistor switch has a collector that applies a reset pulse to an electronic circuit. A pull-up resistor is coupled between the collector of the transistor switch and a power supply voltage developed in a filter capacitor that energizes the electronic circuit. Proper reset operation requires the output supply voltage not to exceed, for example, 0.2 volts, during at least a portion of the reset operation. The user initiates the reset pulse that momentarily disables a power supply for ceasing the generation of the output supply voltage when the reset operation is performed. The value of the resistor is selected to be sufficiently low such that when the transistor switch is conductive, the discharge of the filter capacitor via the pull-up resistor is speeded up for completing the discharge of the filter capacitor in no more than, for example, 2 seconds to provide a maximum level of the output supply voltage that is no more than 5% of its normal operation voltage level.

10 Claims, 3 Drawing Sheets

(56) References Cited

U.S. PATENT DOCUMENTS

| | | |
|---|---|---|
| 7,492,614 B2 | 2/2009 | Furukoshi et al. |
| 2004/0041601 A1 | 3/2004 | Payne et al. |
| 2005/0168201 A1 | 8/2005 | Muellauer |
| 2007/0274104 A1 | 11/2007 | Furukoshi et al. |

FOREIGN PATENT DOCUMENTS

| | | |
|---|---|---|
| JP | 60163119 | 8/1985 |
| JP | 1255911 | 12/1989 |
| JP | 5119871 | 5/1993 |
| JP | 08205391 | 8/1996 |
| JP | 8205398 | 8/1996 |
| JP | 200160667 | 3/2001 |
| JP | 2002023863 | 1/2002 |
| JP | 2002-165155 | 6/2002 |
| JP | 2002165155 | 6/2002 |
| JP | 2003330574 | 11/2003 |
| JP | 2007306218 A | 11/2007 |

\* cited by examiner

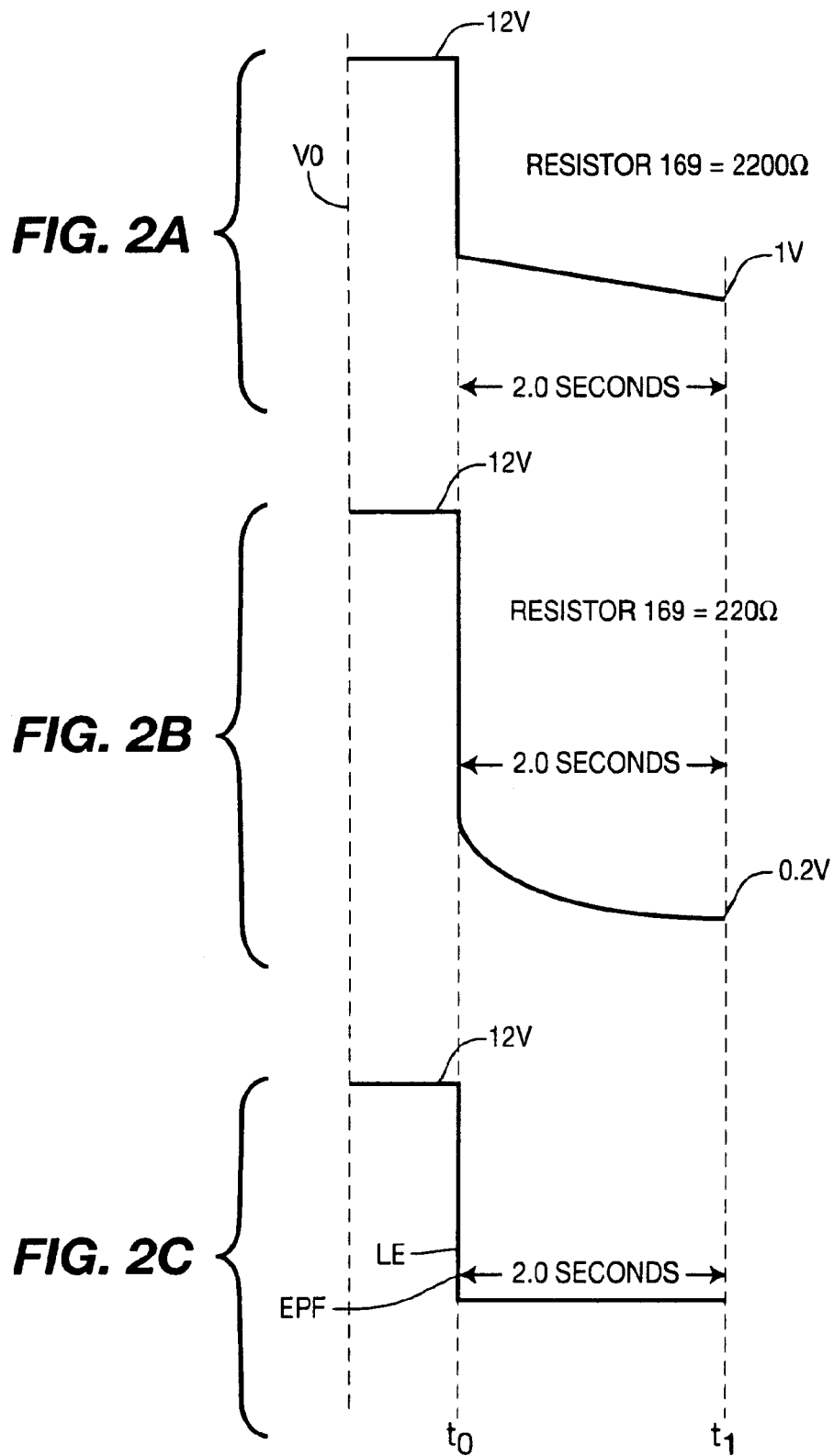

SWITCHABLE LOAD FOR INITIALIZING AN OUTPUT VOLTAGE OF A POWER SUPPLY

CROSS-REFERENCE TO RELATED APPLICATIONS

This application claims the benefit, under 35 U.S.C. §365 of International Application PCT/US2008/013578, filed Dec. 11, 2008 which was published in accordance with PCT Article 21(2) on Sep. 11, 2009 in English and which claims the benefit of United States provisional patent application No. 61/067,902 filed Mar. 3, 2008.

FIELD OF THE INVENTION

The present invention relates to a power supply control arrangement for energizing an initialization arrangement.

BACKGROUND OF THE INVENTION

A typical power supply in a television system such as, for example, a set-top box includes a pre-regulator that produces an output supply voltage in a filter capacitor. The output supply voltage energizes an electronic circuit of the set-top box.

For recovering from an invalid operational mode that might occur in the electronic circuit producing, for example, an objectionable picture "freeze", the user might wish to re-initialize or reset the electronic circuit. Proper initialization or reset operation might require the output supply voltage not to exceed, for example, 0.2 volts, during at least a portion of the reset operation. This is so in order to avoid any latch-up condition in stages of the electronic circuit. Thus, the user would initiate the generation of a reset pulse. The reset pulse, in addition to performing the reset operation, also disables the pre-regulator for stopping the generation of the output supply voltage during the reset operation.

Typically, the output supply voltage is coupled to supply input terminals of post regulators such that the electronic circuit is energized directly from the post regulator. Each of the post-regulators includes, typically, an under-voltage lock-out feature. Immediately after the pre-regulator is disabled, the output supply voltage of the post regulator quickly drops to a threshold level, typically 6 or 7 volts, established by the under-voltage lock-out feature. The post-regulator will reduce the loading of the filter capacitor after reaching the threshold level. Therefore, following the post-regulator output voltage quick drop to the threshold level, the output supply voltage would not be able to continue dropping at a fast rate. Thus, if the filter capacitor were left to discharge with the reduced loading associated with the under-voltage lock-out feature, completion of the proper initialization or reset operation, and hence the subsequent normal operation, would have to be, disadvantageously, excessively extended or delayed.

Delaying normal operation after initiating the reset operation by more than 3 seconds was found irritating to the user. Furthermore, a circuit that produces the user initiated reset pulse is energized by a charge previously stored in a second capacitor. Using a large capacitance for the second capacitor to extend the time that the second capacitance voltage is maintained at a sufficiently large level might not be practical. Therefore, also for this reason, a quick completion of the initialization or reset operation might be required.

SUMMARY OF THE INVENTION

A video apparatus, embodying an inventive feature, includes a power supply for replenishing a charge in a filter capacitor of the power supply to develop an output supply voltage that energizes an electronic circuit of the video apparatus, during normal operation. A first switch generates a switched, control signal that is coupled to an electronic circuit of the video apparatus to perform a reset operation in the electronic circuit when the reset operation is required. The control signal is also applied to the power supply for preventing the replenishment of the charge in the filter capacitor, when the control signal occurs. The apparatus includes a resistor and a second switch for selectively applying the resistor to the filter capacitor, in response to the switched control signal, to produce a switched, discharge current in the capacitor. The resistor has a resistance sufficiently low to reduce the output supply voltage to less than 5% of a normal operation voltage level of the output supply voltage, at an end of a two-second interval that follows the generation of the switched, control signal. With a 10 times larger resistance, the output supply voltage would have been larger than the 5% level at the end of the two-second interval.

BRIEF DESCRIPTION OF THE DRAWINGS

FIGS. 2A, 2B and 2C illustrate waveforms useful for explaining the operation of the arrangement of FIGS. 1A and 1B.

DETAILED DESCRIPTION

Figure 1:
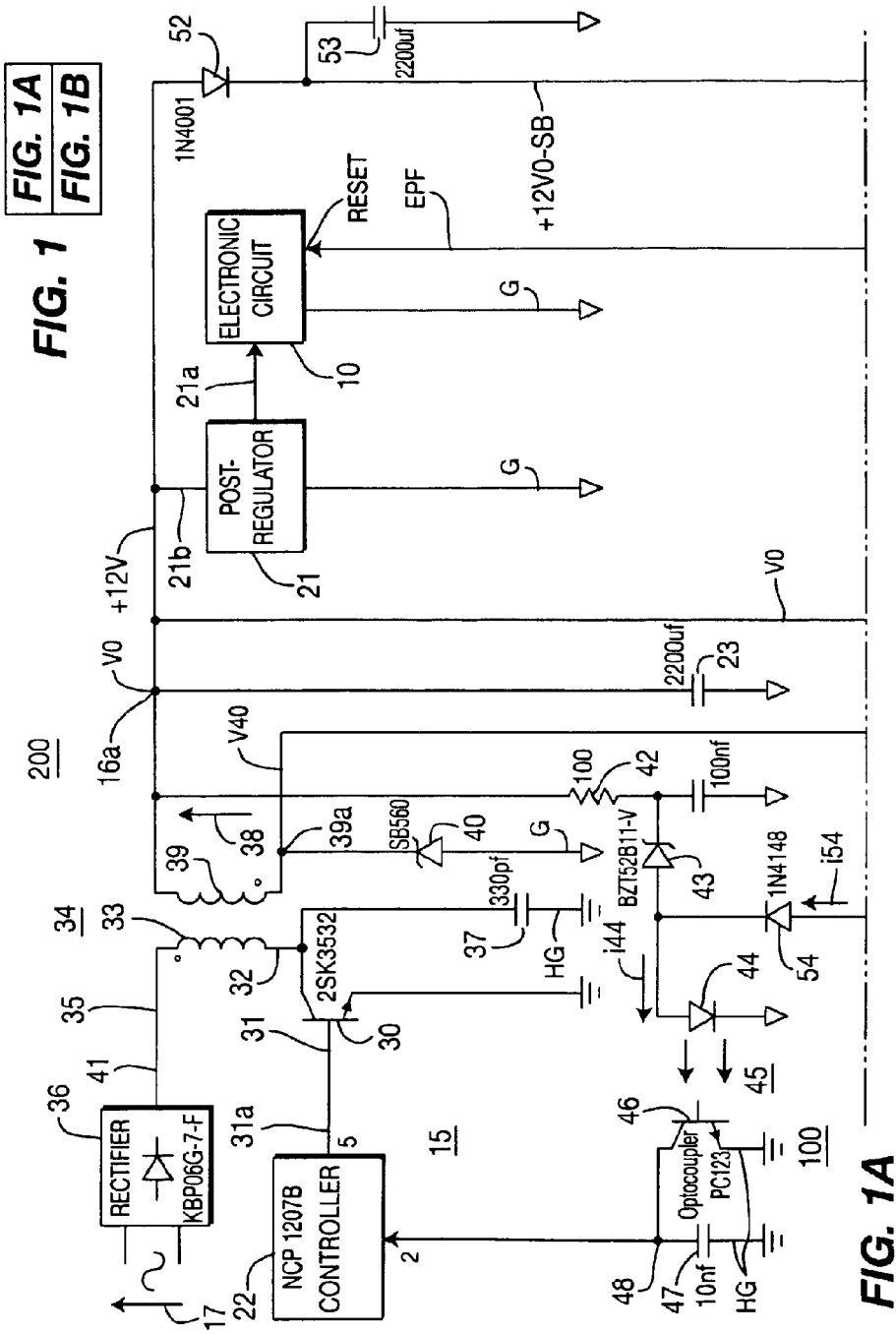
FIGS. 1A and 1B illustrate an arrangement, in accordance with an embodiment of the present invention.

FIG. 1A illustrates a schematic, partially in a block diagram form, of a power supply 100 and a utilization or electronic circuit 10 for example a "set-top box". Electronic circuit 10 is energized by power supply 100.

Power supply 100 includes a conventional pre-regulator 15 having a controller 22. Pre-regulator 15 is referenced to a common ground conductor HG referred to as "hot" ground. Controller 22 produces at a gate terminal 31 of a power transistor 30 a gate drive signal 31a that controls switching operation of chopper power transistor 30. Power transistor 30 is controlled in, for example, pulse-width-modulated manner. The circuit configuration and operation of controller 22 is conventional. Therefore, some circuit details have been omitted for simplification purposes as unnecessary for explaining the operation and structure of power supply 100.

A drain terminal 32 of transistor 30 is coupled to an end terminal of a primary winding 33 of a flyback transformer 34. Terminal 32 is also coupled to a flyback capacitor 37 that forms a resonant circuit with winding 33, during flyback, when power transistor 30 is turned off. A second end terminal 35 of winding 33 that is remote from terminal 32 is coupled to a bridge rectifier 36 that rectifies an alternating current (AC) mains supply voltage 17 to produce an unregulated, filtered direct current (DC) voltage 41 at terminal 35 of winding 33 in a conventional manner.

The switching operation of transistor 30 produces an AC flyback voltage 38 in a secondary winding 39 of transformer 34. Voltage 38 is rectified in a Schottky diode 40. Diode 40 has an anode that is coupled to a common or ground terminal G, referred to as "cold" ground. Ground G and ground HG are conductively isolated from each other. Diode 40 has a cathode that is coupled to an end terminal 39a of winding 39. Consequently, a DC output supply voltage VO is produced at a terminal 16a of a filter capacitor 23 by periodically replenishing a charge in capacitor 23. DC output supply voltage VO, for example, at a level of +12V, is developed at an input 21b of a post-regulator 21 for producing a DC supply voltage, not shown, at an output terminal 21a of post-regulator 21 that energizes electronic circuit 10.

Voltage VO is coupled via a resistor 42 to a cathode of a reference, Zener diode 43. An anode of Zener diode 43 is coupled to an anode of a light emitting diode 44 of an opto-coupler 45. A transistor 46 of opto-coupler 45 is coupled to a charge storage capacitor 47 via a junction terminal 48 for providing a negative feedback signal to controller 22, in a conventional manner.

When, for example, voltage VO exceeds a threshold level that is determined by Zener diode 43 and diode 44, a current i54 flows in diode 44 to produce a collector current in transistor 46, not shown, by opto-coupling operation. Consequently, capacitor 47 is discharged in a manner to reduce a control voltage at terminal 48 in a negative feedback manner. Consequently, the duty cycle of transistor 30 is reduced. Thereby, voltage VO is reduced and regulation is provided.

Figure 1B:
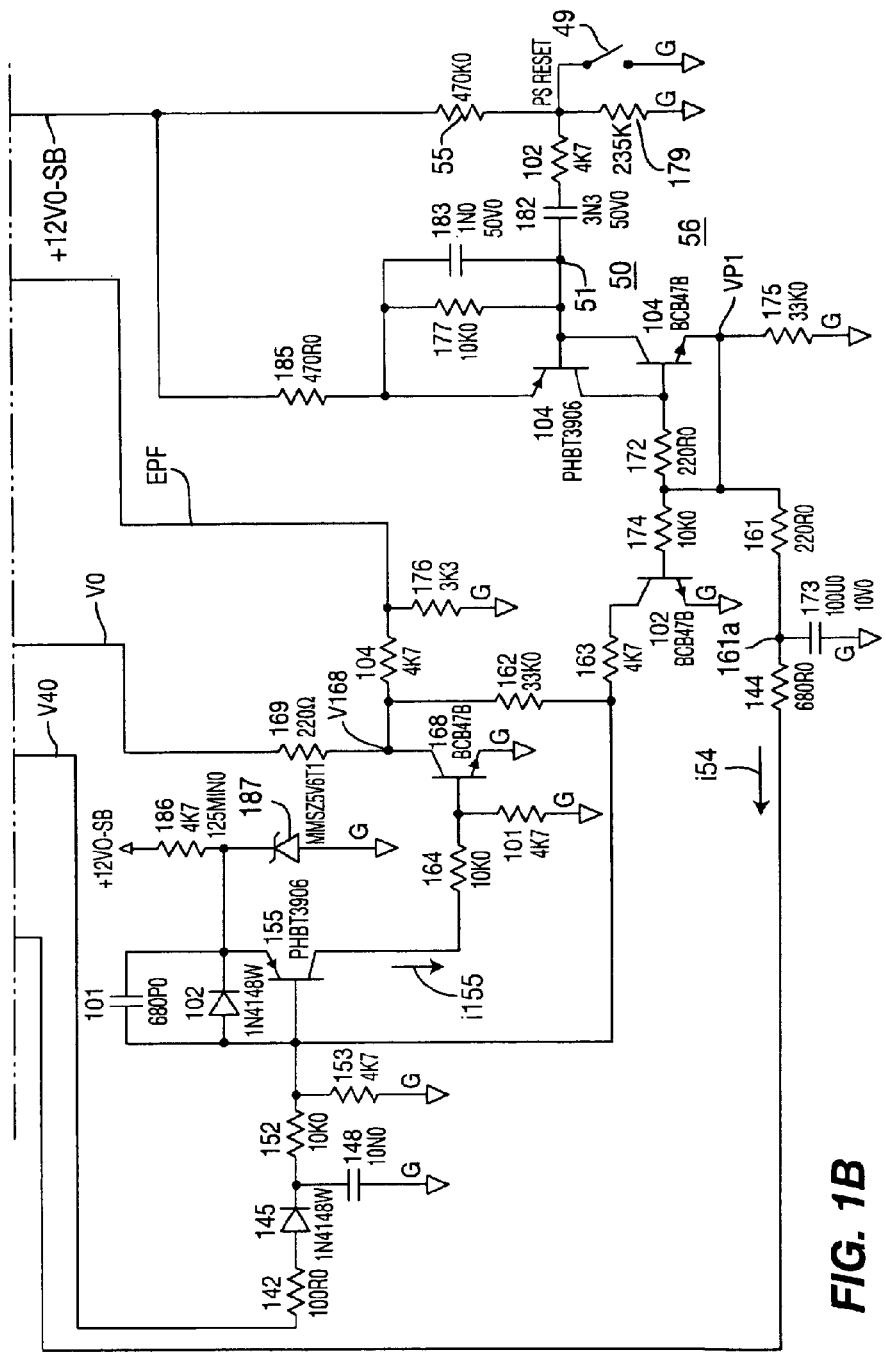

FIG. 1B illustrates an arrangement 200, embodying an inventive feature, for performing a reset operation in electronic circuit 10 of FIG. 1A. Similar symbols and numerals in FIGS. 1A and 1B indicate similar items or functions.

A user controlled pulse generator 56 of FIG. 1B includes a latch 50. Latch 50 includes a PNP transistor 104 having an emitter that is coupled via an emitter resistor 185 to a supply voltage +12VO-SB. Supply voltage +12VO-SB is produced from voltage VO by storing a charge in a charge storage capacitor 53 of FIG. 1A via a diode 52.

Transistor 104 of FIG. 1B is cross-coupled to an NPN transistor 105 such that the base of transistor 104 is coupled to the collector of transistor 105 and the base of transistor 105 is coupled to the collector of transistor 104. Transistor 105 has an emitter that is coupled via an emitter resistor175 to a ground terminal G. A resistor 177 is coupled between the base and emitter terminals of transistor 104.

For recovering from an invalid operational mode that might occur in electronic circuit 10, the user might wish to re-initialize or reset electronic circuit 10. Therefore, the user can initiate the generation of a signal PS-RESET at zero volts relative to ground potential G by manually closing a switch 49. Prior to closing switch 49, signal PS-RESET is at an inactive level of 4 volts that is determined by a voltage divider formed by a pair of resistors 55 and 179. The closing of switch 49 produces a voltage drop transition in signal PS-RESET that is capacitively coupled via a series arrangement of a capacitor 182 and a resistor 102 to an input terminal 51 of latch 50. Consequently, a base current and a collector current are produced in transistor 104. Thus, latch 50 is triggered to maintain both transistors 104 and 105 turned on. After latch 50 is triggered, an emitter voltage VP1 is developed at the emitter of transistor 105 of latch 50 and across an emitter resistor 175. Voltage VP1 is coupled via a resistor 174 to a base electrode of a transistor switch 102. The collector of transistor 102 is coupled to a base of transistor 155 via a resistor 163.

As explained before, AC voltage 38 in winding 39 is rectified in Schottky diode 40. A cathode voltage V40 of diode 40 is coupled via a resistor 142 of FIG. 1B to an anode of a diode 145. A cathode of diode 145 is coupled to a parallel arrangement of a filter capacitor 148 and a voltage divider formed by a resistor 152 coupled in series with a resistor 153 to form a peak rectifier arrangement. The base of a comparator transistor 155 is coupled at a junction between resistors 152 and 153. A threshold voltage of comparator transistor 155 is determined by a breakdown voltage of a Zener diode 187 that is coupled to the emitter of transistor 155. Zener diode 187 is coupled to supply voltage +12VO-SB via a resistor 186 that maintains Zener diode 187 conductive.

In normal operation, voltage VP1 is at zero volts and AC voltage 38 is within a normal operation range. Therefore, peak rectified voltage V40 produces a base voltage of transistor 155 at a level causing comparator transistor 155 to be non-conductive. However, when voltage VP1 is generated, conductive transistor 102 reduces the base voltage of transistor 155 that causes transistor 155 to turn on. The turning on of transistor 155 produces a collector current i155 in transistor 155. Current i155 has a portion that is coupled to the base of a transistor 168 for turning on transistor 168. Another portion of current i155 flows in a resistor 101 that is coupled in parallel with a base-emitter junction of transistor 168. An emitter electrode of transistor 168 is coupled to ground terminal G.

When transistor 168 is turned on by current i155, a collector voltage V168 becomes equal to a saturation voltage of transistor 168. Voltage V168 is coupled via a resistor 104 to develop a signal EPF. Signal EPF is coupled to a reset terminal RESET of electronic circuit 10. Consequently, reset operation is performed in electronic circuit 10. The collector terminal of transistor switch 168 is coupled via a pull-up resistor 169 to capacitor 23.

Voltage VP1 is also coupled via series coupled arrangement of a resistor 161, a resistor 144, diode 54 and diode 44 of opto-coupler 45. In addition, a filter capacitor 173 is coupled between ground G and a junction terminal 161a, between resistors 161 and 144. Consequently, capacitor 47 that is coupled to feedback terminal 48 of FIG. 1A of controller 22 will be discharged. The voltage drop in terminal 48 of controller 22, produced when voltage VP1 is generated, will prevent transistor 30 from being turned on. Consequently, the charge in capacitor 23 will no longer be replenished, as long as voltage VP1 is generated. The result is that pre-regulator 15 is disabled.

FIGS. 2A, 2B and 2C illustrate waveforms useful for explaining the operation of power supply 100 of FIG. 1A and arrangement 200 of FIG. 1B. Similar symbols and numerals in FIGS. 1A, 1B, 2A, 2B and 2C indicate similar items or functions.

FIG. 2a illustrates the manner by which output supply voltage VO decreases as a function of time following a leading edge LE of signal EPF of FIG. 2C, when the value selected for resistor 169 of FIG. 1B is 2200 Ohm. In comparison, FIG. 2B illustrates the manner by which output supply voltage VO decreases as a function of time following leading edge LE of signal EPF of FIG. 2C at a time t0, when the value selected for resistor 169 of FIG. 1B is 220 Ohm, in accordance with an inventive feature.

Initially, after leading edge LE of signal EPF of FIG. 2C, causing pre-regulator 15 of FIG. 1A to become disabled, post regulator 21 heavily loads capacitor 23 so as to discharge capacitor 23 at a first rate. Therefore, output supply voltage VO quickly drops, as shown in each of FIGS. 2A and 2B in the vicinity of time t0. However, when dropping supply voltage VO reaches a threshold level of 6 volts, established by a conventional under-voltage lock-out feature, not shown, of post regulator 21 of FIG. 1A, post regulator 21 forms a much lighter load with respect to capacitor 23. As a result, the discharge rate of capacitor 23 is reduced relative to the first rate.

When voltage VO drops, as a result of, for example, a loss of mains supply voltage 17, diode 52 isolates capacitor 53 from capacitor 23. Therefore, after voltage VO quickly drops, as explained before, supply voltage +12VO-SB, is nevertheless maintained for a finite interval so as to energize latch 50 and zener diode 187 of FIG. 1B. Thus, capacitor 53 of FIG. 1A will remain sufficiently charged to produce voltage VP1, to maintain transistor 168 conductive and to disable controller 22, at least until the reset operation is completed.

Proper initialization or reset operation can require output supply voltage VO not to exceed, for example, 0.2 volts, during the reset operation. This can be required in order to avoid any latch-up condition in stages of electronic circuit 10. Slow discharge of capacitor 23 can have delay or extend significantly the completion of proper initialization or reset operation.

Delaying normal operation by, for example, more than 3 seconds was found to irritate the user. Furthermore, pulse generator 56 of FIG. 1B that produces user initiated pulse voltage VP1 is energized by the charge previously stored in capacitor 53. However, the size of capacitor 53 is, typically, restricted to a value permitting no more than 3 seconds of energizing pulse generator 56.

In carrying out an inventive feature, the value of resistor 169 is selected to be sufficiently low such that filter capacitor 23 becomes heavily loaded. Thus, advantageously, when transistor switch 168 is conductive, the discharge of filter capacitor 23 via resistor 169 is speeded up for discharging capacitor 23 in less than 2 seconds to less than 5% of the normal operation voltage level of voltage VO. FIG. 2B shows that voltage VO is at 0.2V at time t1, at the end of the 2-second interval from leading edge LE of FIG. 2C. Advantageously, voltage VO at 0.2V does meet the voltage requirement for proper reset operation. Also, advantageously, in normal operation, resistor 169 forms only a negligible load with respect to filter capacitor 23 in normal operation, when transistor switch 168 is non-conductive.

In contrast, when the value of resistor 169 is 10 times larger, as shown in FIG. 2A, the voltage level of voltage VO at the end of the 2 second interval is larger than 5% of voltage VO normal operation level. Thus, if the value selected for resistor 169 of FIG. 1B were 2200 Ohm, voltage VO of FIG. 2A would be at 1V at time t1, at the end of a 2-second interval from leading edge LE of FIG. 2C. Voltage VO at 1V would be more than 5% of voltage VO normal operation level that is 12V. Thus, the 1V level, would not meet the maximum voltage requirement for proper reset operation.

During normal operation, when switch 49 is open, AC voltage 38 of FIG. 1A is at a normal operation level and signal EPF is at an inactive level. However, when, as a result of power loss or brownout, the amplitude of AC voltage 17 becomes smaller than required, peak rectified voltage V40 would no longer produce the base voltage of transistor 155 of FIG. 1B at the level that is sufficient to maintain transistor 155 non-conductive. A time constant associated with discharging capacitor 148 is smaller than a period of AC voltage 17 of FIG. 1A that is approximately 20 millisecond. Therefore, soon after the amplitude of AC voltage 17 becomes smaller than the normal operation range, transistor 168 of FIG. 1B will turn on to generate signal EPF. Thus, signal EPF provides, advantageously, an early power fail warning.

Early Power Fail signal EPF indicates an interruption or a power outage in AC mains supply voltage 17 of FIG. 1A long before output supply voltage VO drops outside the normal operation range of voltage VO. Early Power Fail signal EPF can initiate a power down procedure in a microprocessor, not shown, of electronic circuit 10 in a well known manner. Thus, advantageously, transistor 168 of FIG. 1B provides both proper reset operation for user initiated reset operation and a shut-down operation of electronic circuit 10.

The invention claimed is:

1. A method for performing a reset operation in an electronic circuit of a video apparatus, comprising the steps of:

replenishing a charge in a filter capacitor of a power supply to develop an output supply voltage that energizes said electronic circuit during normal operation;

generating a switched, control signal that is indicative when said reset operation is required;

applying said switched control signal to a reset input of said electronic circuit to perform the reset operation;

selectively applying a resistor to said filter capacitor by a switching operation, in response to said switched control signal, to produce a switched, discharge current in said capacitor, said resistor having a resistance sufficiently low to reduce said output supply voltage to less than 5% of a normal operation voltage level of said output supply voltage, at an end of a two-second interval that follows the generation of said switched, control signal, such that, with a 10 times larger resistance, said output supply voltage would have been larger than the 5% level at said end of said two-second interval; and preventing the replenishment of said charge in said filter capacitor, in response to said switched control signal, prior to a time when said output supply voltage is reduced to less than 5% of said normal operation voltage level.

2. The method according to claim 1 wherein said utilization circuit is included in a set top box.

3. A video apparatus, comprising:

a power supply for replenishing a charge in a filter capacitor of said power supply to develop an output supply voltage that energizes an electronic circuit of said video apparatus during normal operation;

a first switch for generating a switched, control signal that is coupled to an electronic circuit of said video apparatus to perform a reset operation in said electronic circuit when said reset operation is required, a resistor; and a second switch for selectively applying said resistor to said filter capacitor, in response to said switched control signal, to produce a switched, discharge current in said capacitor, said resistor having a resistance sufficiently low to reduce said output supply voltage to less than 5% of a normal operation voltage level of said output supply voltage, at an end of a two-second interval that follows the generation of said switched, control signal, such that, with a 10 times larger resistance, said output supply voltage would have been larger than the 5% level at said end of said two-second interval such that said control signal is also applied to said power supply for preventing the replenishment of said charge in said filter capacitor, in response to said switched control signal, prior to a time when said output supply voltage is reduced to less than 5% of said normal operation voltage level.

4. An apparatus according to claim 3 wherein said resistance is selected to reduce said output supply voltage to less than one half volt at an end of said two-second interval.

5. An apparatus according to claim 3 wherein said second switch comprises a transistor and wherein said resistor comprises a pull-up resistor of said transistor.

6. An apparatus according to claim 3 further comprising a source of an input supply voltage for energizing said power supply, wherein said switch is also responsive to said input supply voltage for generating an early power fail signal.

7. An apparatus according to claim 5 wherein said early power fail signal is generated at a junction terminal between said second switch and said resistor.

8. An apparatus according to claim 3 wherein said control signal is coupled to said electronic circuit of said video apparatus via said second switch to perform said reset operation in said electronic circuit.

9. An apparatus according to claim 8 further comprising a source of an input supply voltage for energizing said power supply, wherein said second switch is also responsive to said input supply voltage for generating an early power fail signal.

10. A video apparatus, comprising:
a power supply for replenishing a charge in a filter capacitor of said power supply to develop an output supply voltage that energizes an electronic circuit of said video apparatus during normal operation;
a first switch for generating a switched, control signal that is coupled to an electronic circuit of said video apparatus to perform a user initiated reset operation in said electronic circuit when said reset operation is required at a time when said output supply voltage is at a normal operation voltage level, said control signal being also applied to said power supply for preventing the replenishment of said charge in said filter capacitor, when said control signal occurs;
a resistor; and
a second switch for selectively applying said resistor to said filter capacitor, in response to said switched control signal, to produce a switched, discharge current in said capacitor, said resistor having a resistance sufficiently low to reduce said output supply voltage to less than 5% of a said normal operation voltage level of said switched, control signal, such that, with a 10 times larger resistance, said output supply voltage would have been larger than the 5% level at said end of said two-second interval.

* * * * *